United States Patent [19]

Kim et al.

[11] Patent Number: 5,146,075
[45] Date of Patent: Sep. 8, 1992

[54] LIGH ACTIVATED HIGH POWER INTEGRATED PULSER

[75] Inventors: Anderson H. Kim, Toms River; Maurice Weiner; Stephen Levy, both of Ocean; Robert J. Zeto, Eatontown, all of N.J.

[73] Assignee: The United States of America as represented by the Secretary of the Army, Washington, D.C.

[21] Appl. No.: 681,253

[22] Filed: Apr. 8, 1991

[51] Int. Cl.[5] ........................................... H01J 40/14
[52] U.S. Cl. ............................. 250/211 J; 250/208.6
[58] Field of Search ............ 250/211 J, 211 R, 208.4, 250/208.6, 551, 213 A; 357/30 P, 30 M, 30 Q, 30 A

[56] References Cited

U.S. PATENT DOCUMENTS

| | | | |
|---|---|---|---|
| 4,157,926 | 6/1979 | Schoolar | 250/211 J |
| 4,449,044 | 5/1984 | Rotolante et al. | 250/211 J |
| 4,691,111 | 9/1987 | Bovino | 250/211 J |
| 4,782,222 | 11/1988 | Ragle et al. | 250/211 J |
| 4,822,991 | 4/1989 | Riggs et al. | 250/211 J |
| 5,017,793 | 5/1991 | Halsey et al. | 250/551 |
| 5,047,621 | 9/1991 | Weiner et al. | 250/211 J |
| 5,047,623 | 9/1991 | Wilcox | 250/551 |
| 5,051,789 | 9/1991 | Rosen et al. | 250/551 |

*Primary Examiner*—David C. Nelms
*Assistant Examiner*—Michael Messinger
*Attorney, Agent, or Firm*—Michael Zelenka; William H. Anderson

[57] ABSTRACT

A high power pulse generating system for use in impulse radar systems and the like contains a plurality of pulser units. The pulser units are circular shaped PIN diodes which integrates a light activated switch and a storage capacitor into a single structure formed on a semiconducting wafer. The pulser units have the capability of outputting pulses having a width of less than one nanosecond, facilitating high power output. The outputs of the pulser units are combined when each of the pulser units is simultaneously discharged using multiple laser pulses. In another embodiment a voltage step-up transformer is formed by a PIN diode structure having a diameter of approximately 60 mm. This device has the capability of outputting voltage amplitudes equal to or greater than the voltage level used to charge the PIN diode.

20 Claims, 4 Drawing Sheets

5,146,075

LIGH ACTIVATED HIGH POWER INTEGRATED PULSER

TECHNICAL FIELD

The present invention relates generally to high power pulse generating systems, and more particularly to a pulse generating system having a plurality of individual pulser units with combined outputs.

BACKGROUND ART

High power pulse generating systems are used to generate the output signals irradiated by antennas in radar jammers, impulse radar and high power microwave weapons. Such systems require high output levels and usually have a large number of pulser units arranged in arrays with combined outputs. Higher output power requirements by radar jammers necessitate greater numbers of pulser arrays, and greater system costs. Modern electric warfare requires impulse radar and jamming systems having increasingly higher output power levels. To limit system cost, it is necessary to improve the performance of the pulser units.

The simplest form of pulser unit is shown in FIG. 1. The energy storage portion 10 is charged from an external source, not shown in FIG. 1. At an appropriate time, switch 11 is closed, discharging the stored energy into load 12. After discharge, switch 11 is opened and the energy storage portion recharged. Arrangements for charging the energy storage portion and control systems for operating switch 11 are both well known.

The repetition rate of the pulser unit is determined by the time necessary to charge the energy storage portion to an appropriate level and the time necessary to discharge the stored energy into the load. These time periods are determined by the nature of the energy storage portion as well as the nature of the switching device. The output power of the pulser unit is defined as $P = E/t$ (in watts)

where t is the discharge time of the energy stored portion and E is the amount of energy stored (in Joules).

One way of maximizing the output power of a pulser unit is to make the discharge time period t as short as possible. This appears to be the most practical approach to increasing pulser unit output since there are upper limits on the amount of energy that can be stored in any practical energy storage device.

Conventional pulser units consist of discrete energy storage portions such as capacitors and switches of various types. As is well known, it is very difficult to achieve high power, high energy density pulser units using discrete components. In order to generate the narrow pulses required to facilitate high power outputs, it is necessary to use a large number of pulse shaping stages, also discrete components. These additional pulse shaping stages add substantially to the cost of the pulse generating system, lower energy density and render the combination of pulser units less efficient.

The lower energy density caused by discrete components and plural pulse shaping stages results in substantially greater space requirements for large systems. Since many of the components in a large pulse generating system are physically separated, triggering coordination and interconnections between components become more complex and greater electrical losses occur as systems increase in size.

As in any system using multiple generation units, important factors in a high power pulse generation system are the energy density of the overall system and the efficiency of the pulser units. Modern impulse radar, radar jammers and microwave weapons systems require marked improvements in both factors to economically supply the high output power demanded in electronic warfare.

DISCLOSURE OF THE INVENTION

An object of the invention is to increase the speed of pulser unit discharge.

Another object of the invention is to increase the energy density of pulser units and decrease the size of pulse generating systems.

A further object of the invention is to efficiently combine the outputs of pulser units.

Another object of the invention is to quickly and efficiently trigger multiple pulser units simultaneously.

According to the present invention, a high energy integrated pulser includes a light activated switch and a means for charge storage, both integrally formed on a semiconductor substrate having metallic layers on each of its two major surfaces.

Another embodiment of the present invention is a high power pulse generating system having a semiconductor substrate with two major surfaces and a plurality of light activated integrated pulser units. Each of the light activated integrated pulser units includes a PIN diode. The PIN diode contains a switch means and a storage means integrally formed on the semiconductor substrate.

When electric charge is stored on the metallic layers of the aforementioned structures, electric waves are propagated over the surfaces of the metallic layers. Since the outer edges of the metallic layers act as infinite resistances, standing waves are established. The possibility exists that standing waves reflected from different outer edges of a metallic layer will interfere with each other, reducing the energy available for output.

Another object of the invention is to prevent standing wave interference on pulser units.

A further object is to increase output voltage of pulser units.

Preferably, a further aspect of the present invention is a pulse generating system having a light-activated switch means, charge storage means and step-up voltage transformer means, all integrated into a single pulser unit. The pulser unit is a PIN diode formed on a semiconductor substrate having two major surfaces. The semiconductor substrate is roughly circular in shape and has a diameter of approximately 75 millimeters. The PIN diode is formed with roughly circular metallic layers on each of the major surfaces of the semiconductor substrate. The metallic layers are approximately 60 millimeters in diameter. The PIN diode also includes means for receiving light formed at the center of one of the metallic layers and means for outputting a signal formed at the center of the second metallic layer. This structure has the capability of generating an output voltage greater than or equal to the value of the voltage used to charge the PIN diode.

BEST MODE FOR CARRYING OUT THE INVENTION

Figure 2:
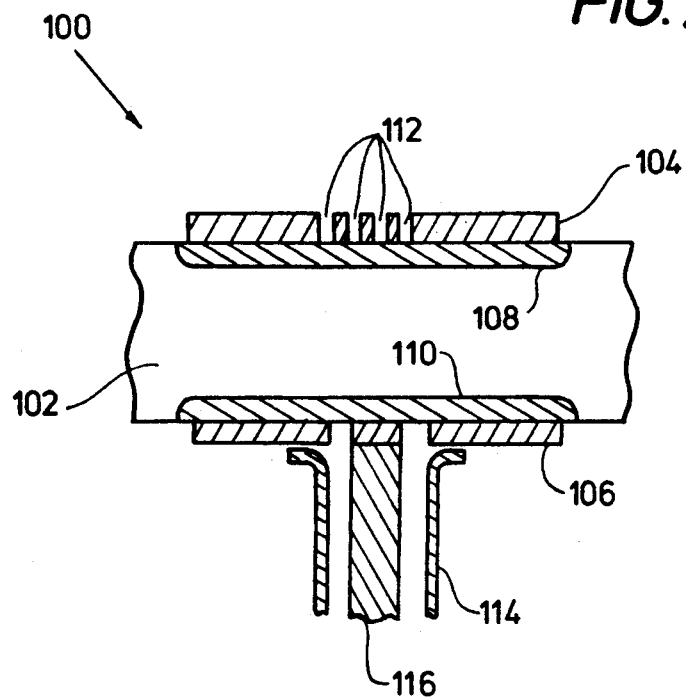
FIG. 2 is a cross-sectional diagram showing the details of an individual integrated pulser unit.

An integrated pulser unit 100 is shown in FIG. 2. In this example, the integrated pulser unit is a PIN diode formed on a substrate 102 having metallic layers 104, 106 aligned with each other on the two major surfaces of the semiconductor substrate. A highly doped p-type layer 108 is formed under one metallic layer 104, and a highly doped n-type layer 110 is formed underneath the other metallic layer 106.

The PIN diode is activated or triggered by light passing through holes 112 in the first metallic layer, and impinging on the highly doped p-type layer 108. Once activated by light, the PIN diode conducts, and charge stored therein is transferred from the first metallic layer 104 to the second metallic layer 106 and through inner and outer conductors 116, 114 to a load such as an antenna (not shown). The PIN diode is charged by a pulse charging unit (shown in FIG. 6) connected to the two metallic layers 104, 106, in a well known manner. The PIN diode combines an energy storage capacitor with a high speed light activated switch in a single integrated unit. The result is a pulser unit with high energy density and low discharge time.

The substrate material is preferably GaAs having a very high dielectric constant (see below) This material maximizes the hold-off voltage capability, that is, the voltage level capable of being stored by the capacitor. The energy which can be stored by the PIN diode is a function of the hold-off voltage capability and is expressed as $$E = \tfrac{1}{2} CV^2 = \tfrac{1}{2}\left(\frac{\epsilon A}{d}\right)V^2$$

$$= 3.64 \times 10^{-12}\left(\frac{V^2}{d}\right) \text{(Joule)}$$

where
E = energy (J)
C = capacitance (F)
$\epsilon$ = dielectric constant (for GaAs $\epsilon = 1.15 \times 10^{-12}$ F/cm
A = area of metallized electrode (cm$^2$)
d = substrate thickness (cm)

The power that is delivered by the pulse unit 100 is expressed as $$P = \frac{E}{\Delta t} = \frac{E}{\text{pulsewidth}} = 14.56 \times 10^3 \frac{V^2}{d} \text{ (Watts)}$$

For example, where the thickness of the substrate is 2.5 cm and a charging voltage of 15 kv is applied to the PIN diode, an output having a pulse width of 0.24 ns and power level of approximately 13MW is calculated to result from an individual pulser unit approximately 20 mm in diameter.

Optimal substrate thickness is determined by the kind of laser system used to trigger the PIN diode. For an Nd:YAG laser system the substrate is preferably between 0.5 and 1.2 cm. For a laser diode or a laser diode array the substrate thickness is preferably between 0.2 and 0.6 cm. Normally an Nd:YAG laser will be used when the bias voltage charging the PIN diode has a range below 80 kv. In this arrangement, an output voltage of under 40 kv will be realized from the PIN diode. Normally, a laser diode or laser diode array will be used when the bias voltage charging the PIN diode has a range of under 30 kv. The resulting output voltage from the PIN diode will be under 15 kv. Depending upon the type of laser used, the optical pulse triggering the PIN diode will be in the range of 0.1 to 40 ns. The use of laser triggering permits the fast discharge and the narrow output pulse width of less than 0.25 ns.

When energy is stored on the PIN diode, electric signals are propagated over the area of the metallic layers. Since the edges of the metallic layers act as infinite impedances, standing waves will be established. When the standing waves are reflected from different outer edges of the metallic layers, the possibility of interference and subsequent energy loss exists. To avoid this, straight edges on the metallic layers and the resulting sharp angles formed by the intersections of such edges are eliminated from the present invention. The most expedient way of doing this is by forming the entire PIN diode in the shape of a circle as shown by pulser units 100A ... 100I in FIG. 3.

Figure 3:
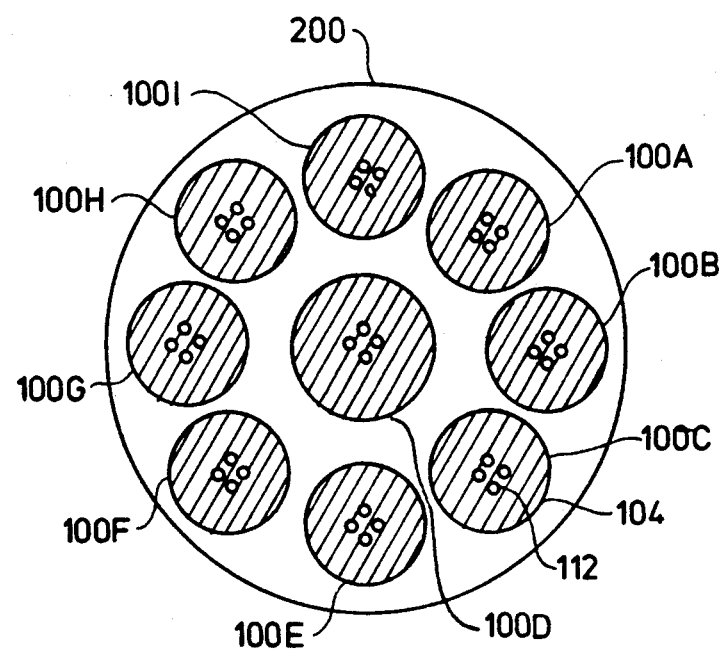
FIG. 3 is a top view diagram of a semiconductor wafer containing nine individual integrated pulser units.

The circular integrated pulser units of the present invention can be combined by forming a plurality of them (up to nine) on a standard 75 mm semiconducting wafer of GaAs. An arrangement of nine pulser units wafer is shown in FIG. 3. Each of the individual pulser units 100A ... 100I is 20 mm in diameter. The inputs of all the individual pulser units are formed on the same side of semiconducting wafer 200. The outputs of all the individual pulser units are formed on the opposite side of wafer 200. The compactness of this arrangement facilitates easy simultaneous triggering of all the pulser units and an efficient connection arrangement to combine their outputs.

Figure 4:
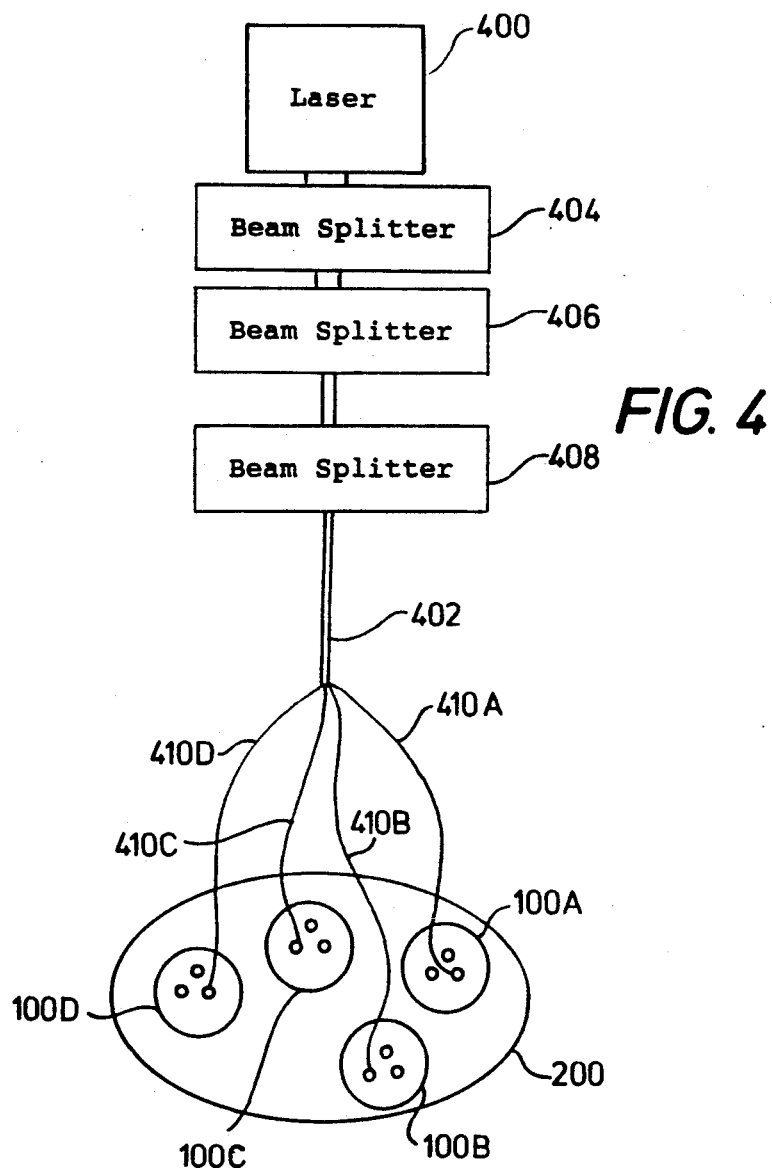
FIG. 4 is a diagram showing apparatus for triggering individual integrated pulser units mounted on a single semiconductor wafer.

In the example of FIG. 4, an Nd:YAG laser system 400 is used to trigger individual pulser units 100A ... 100D. Beam splitters 404, 406, 408 are used to split the laser beam into a number of sub-beams corresponding to the number of individual pulser units 100A ... 100D contained on wafer 200. When the proper number of sub-beams are generated they are fed through fiber optic bundle 402 and then into individual optic fibers 410A ... 410D corresponding to the integrated pulser units.

Figure 5:
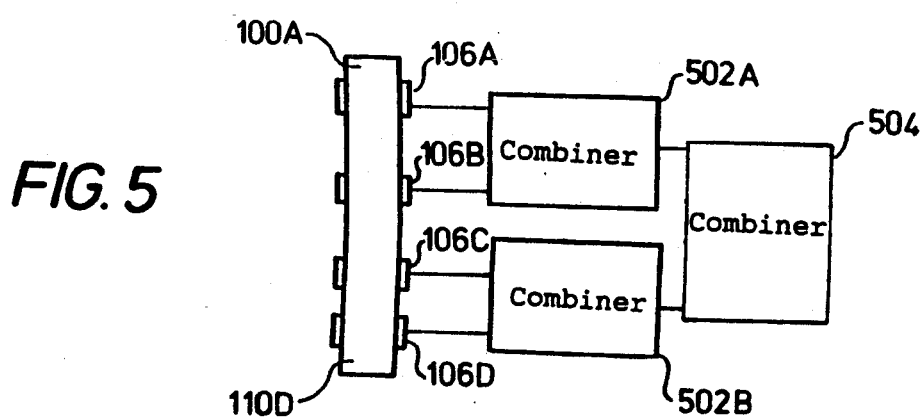
FIG. 5 is a diagram showing apparatus for combining the outputs of individual integrated pulser units mounted on a semiconductor wafer.

FIG. 5 shows an arrangement for combining the outputs of integrated pulser units 100A ... 100D contained on wafer 200. Output signals from metallic layers 106A ... 106D are fed to a first set of combiners 502A, 502B, corresponding to the number of integrated pulser units contained on wafer 200. A second combiner unit 504 combines outputs of two of the first combiner units 502A, 502B. The number of second combiner units 504 will correspond to the number of first combiner units being used. Subsequent sets of combiner units are used as necessary until the outputs of all the integrated pulser units on wafer 200 are output by a single combiner unit. The output of this combiner unit (shown as 504 in FIG. 5) can be combined with a corresponding output from another wafer or can be connected to a load such as a wide band antenna for a radar jamming system.

Figure 1:
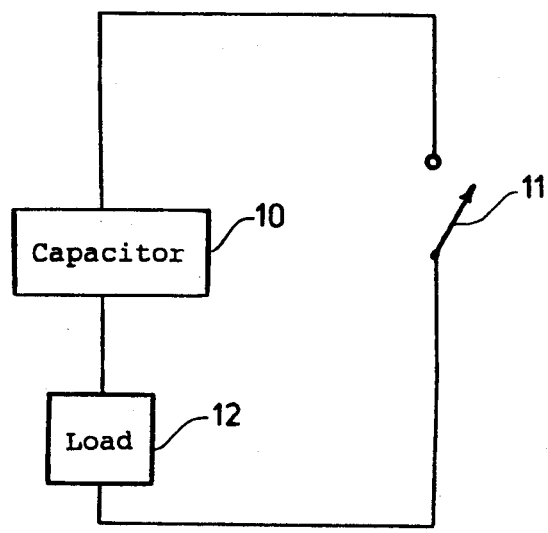
FIG. 1 is a diagram of a basic individual pulser unit.
Figure 6:
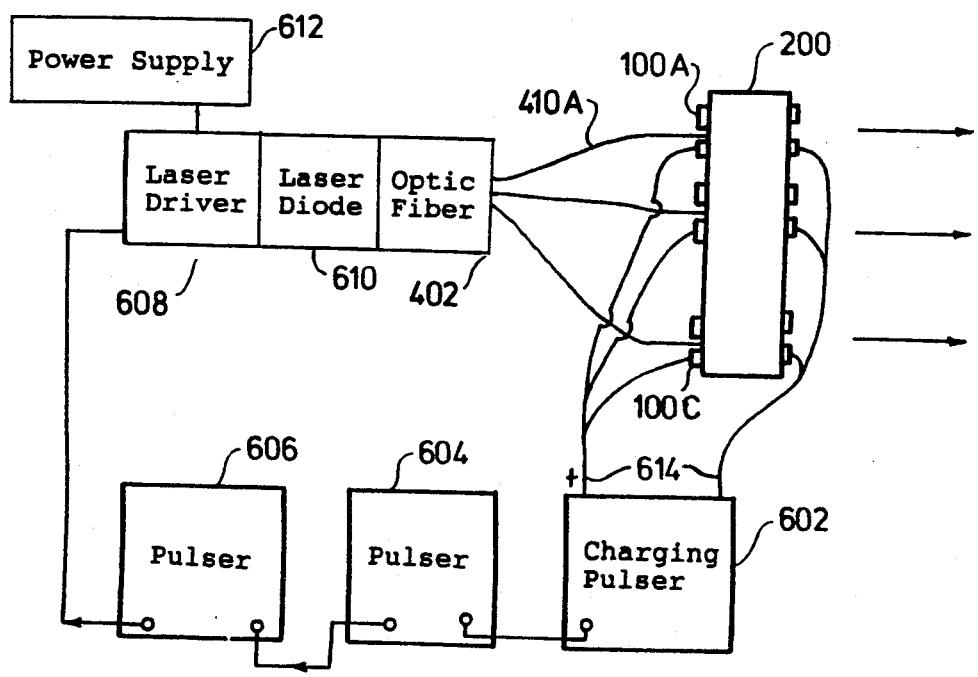
FIG. 6 is a block diagram showing apparatus for charging and discharging individual integrated pulser units mounted on a semiconductor wafer.

The integrated pulser units are charged by means of a potential connected across the two metallic layers on each pulser unit. In FIG. 6 a high voltage charging pulser 602 is connected to each of the integrated pulser units 100A ... 100C on semiconductor wafer 200. The generation of charging voltage pulses and trigger pulses from the laser diode 610 is controlled by pulse generator 604.

A trigger output from pulse generator 604 is fed to a second pulser generator 606 which in turn outputs a delayed pulse to laser driver 608. Power to the laser driver 608 is supplied by a low voltage power supply 612. The laser driver 608 controls laser diode 610 which outputs optical pulses through fiber optic bundle 402. Pulse generator 604 also controls high voltage charging pulser 602 to charge the integrated pulser units 100A ... 100C. When the maximum hold off voltage has been realized on the individual integrated pulser units, the pulse generator 604 controls high voltage charging pulser 602 to disconnect from the pulser units. Before substantial decay of the charge on integrated pulser units 100A ... 100C can occur, pulse generator 604 controls laser driver 608 through pulse generator 606 to trigger the integrated pulser units and discharge their stored energy through an output arrangement previously described and shown in FIG. 5.

Figure 7A:
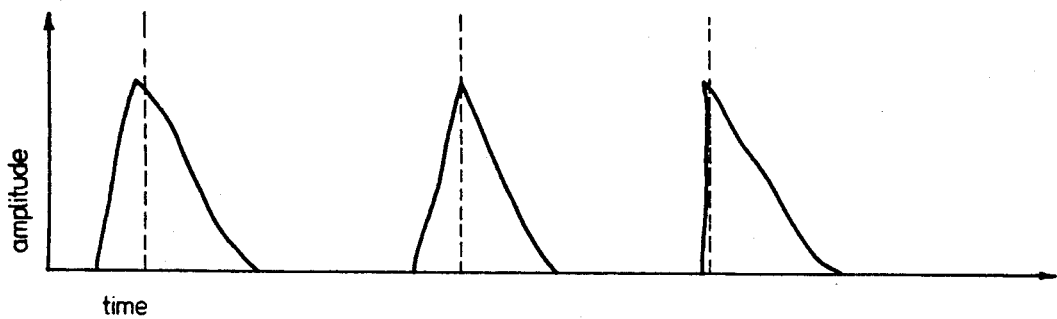
FIGS. 7a, 7b, and 7c are diagrams showing the relative timing of pulses generated in the operation of the present invention.
Figure 7B:
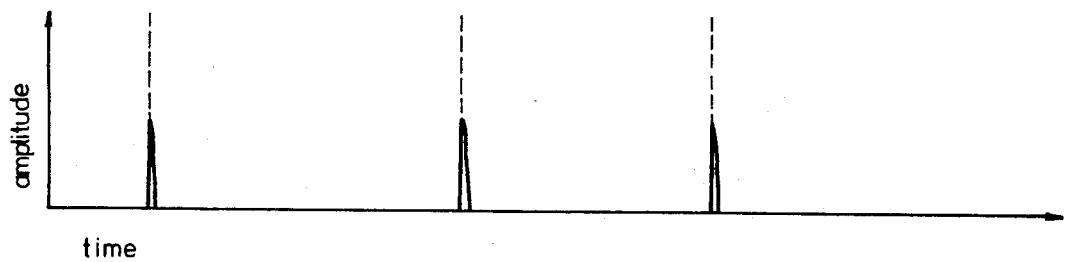
Figure 7C:
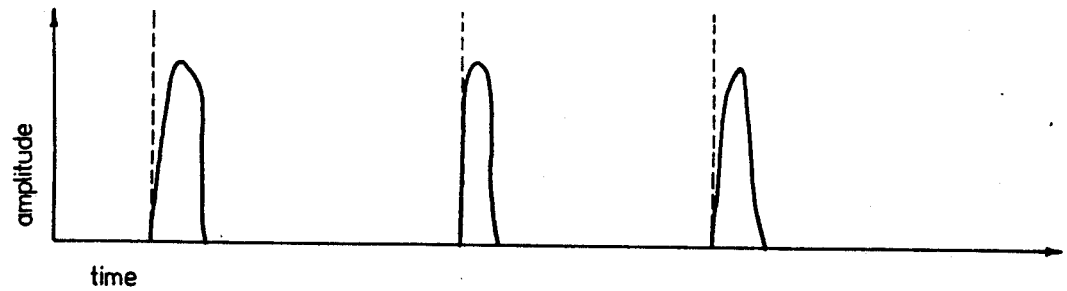

FIGS. 7a, 7b and 7c show the relative timing of the various pulses generated for the present invention. The graph of FIG. 7a shows the amplitude of the charging voltage on the PIN diode. This voltage takes between two and three microseconds to reach the required peak. Under normal circumstances 20 to 40 microseconds would be required to fully dissipate all the electrostatic energy stored by an individual pulser unit. However, whenn the peak hold-off voltage is reached, an optical triggering pulse from a laser is applied to the integrated pulser unit.

The optical pulse as shown on the graph of 7b is from 0.1 ns to 40 ns in width. Normally, each of the integrated pulser units is triggered simultaneously by such optical pulses.

The graph on FIG. 7c shows the output voltage from an individual pulser unit. The amplitude of the output voltage is approximately one half that of the charging voltage, and the output pulse width is approximately 0.24 ns. As previously described it is the sub-nanosecond output pulse width that permits the high power output of the individual integrated pulser units and of a pulse generating system combining the outputs of such pulser units.

The pulse frequency rate, PRF, varies depending upon the type of laser used as a trigger. The PRF for an Nd:YAG laser is less than one kilohertz. The PRF for a laser diode or a laser diode array is less than 100 MHz.

Normally each of the integrated pulser units on a semiconductor wafer is discharged simultaneously. However, the individual integrated pulser units on semiconductor wafers can be discharged at different times. Also, semiconductor wafers having simultaneous discharge of all their individual integrated pulser units can be output at different times, as required by the duty cycle of the overall pulse generating system.

When the PIN diode of the present invention is enlarged to a diameter of approximately 60 mm, an impedance variation exists between the inner and outer edges of the metallic layers. This impedance variation acts like a step-up voltage transformer during the discharge period of the PIN diode. Consequently, an increased output voltage is obtained. When an ND:YAG layer is used to trigger a 60 mm diameter PIN diode of the present invention, charged to a hold-off voltage just under 80 kv, an output voltage of just under 100 kv is possible. When a laser diode is used on the same device charged to a hold-off voltage of just under 30 kv, an output voltage just under 40 kv can be obtained. These results do not occur for PIN diodes having the same structure but a diameter of only 20 mm.

Although a number of arrangements of the invention have been mentioned by way of example, it is not intended that the invention be limited thereto. Accordingly, the invention should be considered to include any and all configurations, modifications, variations, combinations or equivalent arrangements falling within the scope of the following claims.

What is claimed is:

1. A high power integrated pulser comprising:
    a light activated means for switching; and
    means for storing charge;
    said light activated means for switching and said means for storing charge integrally formed on a semiconductor substrate having at least two surfaces with metallic layers formed on at least two of the surfaces, said metallic layers forming a step-up voltage transformer over a distance between a center point of said metallic layers to an outer point of said metallic layers so that an output voltage of the high energy integrated pulser is equal to or greater than a corresponding voltage used to charge said high energy integrated pulser.

2. A high power pulse generating system comprising:
    a semiconductor substrate;
    a plurality of light activated integrated pulser units each generating an output signal and each said light activated integrated pulser unit comprising a PIN diode including switching and capacitor elements integrally formed on said semiconductor substrate, wherein said capacitor elements form a step-up voltage transformer over a distance from a center point of said capacitor element to an outer point of said capacitor element so that an output voltage of each integrated pulser unit is equal to or greater than a corresponding voltage used to charge said capacitor elements; and
    means to combine said output signals.

3. The high power pulse generating system of claim 2 wherein said semiconductor substrate includes at least two surfaces and each said PIN diode comprises:
    a first metallic layer formed on a first surface of said substrate;
    a first highly doped layer formed under said first metallic layer;
    a second metallic layer formed on a second surface of said semiconductor substrate;

a second highly doped layer formed under said second metallic layer;

means for receiving light, formed on said first surface of said semiconductor substrate; and means for outputting a signal, formed on said second surface of said semiconductor substrate.

4. The high power pulse generating system of claim 3 wherein said semiconductor substrate is composed of GaAs.

5. The high power pulse generating system of claim 4 wherein said semiconductor substrate is a substantially circular wafer approximately 75 mm in diameter.

6. The high power pulse generating system of claim 4 wherein said semiconductor wafer contains at least three light activated integrated pulser units, each substantially circular in shape and approximately 20 mm in diameter.

7. The high power pulse generating system of claim 6 wherein said light activated integrated pulser units are discharged by light from a laser source.

8. The high power pulse generating system of claim 7 further comprising a fiber optic bundle providing an optic fiber to each said light activated integrated pulser unit to transmit light from said laser source to said light activated integrated pulser units.

9. The high power pulse generating system of claim 8 further comprising a series of beam splitters positioned between said laser source and said light activated integrated pulser units, and corresponding in number to the number of said light activated integrated pulser units.

10. The high power pulse generating system of claim 8 wherein said laser source is an Nd:YAG type laser.

11. The high power pulse generating system of claim 8 wherein said laser source is a laser diode.

12. The high power pulse generating system in claim 10 wherein each of said light activated integrated pulser units is charged by a bias voltage of less than an 80 kv.

13. The high power pulse generating system of claim 11 wherein each said light activated integrated pulser units is charged by a bias voltage of less than 30 kv.

14. The high power pulse generating system of claim 10 wherein said high power pulse generating system operates at a charge-discharge cycle having a frequency of less than 1 KHz.

15. The high power pulse generating system of claim 6 wherein said high power pulse generating system operates at a charge-discharge cycle having a frequency of less than 100 MHz.

16. The high power pulse generating system of claim 6 further comprising means connected to the means for outputting a signal of each said light activated integrated pulser unit, for combining output signals of said light activated integrated pulser units.

17. The high power pulse generating system of claim 3 wherein said means for receiving light comprises a plurality of holes in said first metallic layer, said holes being located near the center of said first metallic layer and wherein each PIN diode has an output voltage greater than or equal to a value of a voltage used to charge each PIN diode.

18. The high power pulse generating system of claim 8 wherein said means for outputting a signal comprises a substantially circular discontinuity in the second metallic layer with a corresponding discontinuity in the second highly doped layer and a substantially circular protrusion having a metallic layer and a highly doped layer, said substantially circular protrusion arranged substantially in the center of said circular discontinuity.

19. The high power pulse generating system of claim 16 further comprising at least one additional semiconductor substrate having a plurality of light activated integrated pulser units and means for combining, all said means for combining of said semiconductor substrates connected so that outputs of all said light activated integrated pulser units of all said semiconductor substrates are combined.

20. The high power pulse generating system of claim 2, further comprising means for triggering each light activated integrated pulser unit in a predetermined sequence.

* * * * *